United States Patent
Lim (10) Patent No.: US 10,585,126 B2
(45) Date of Patent: Mar. 10, 2020

(54) APPARATUS AND METHOD TO MEASURE AC POWER

(71) Applicant: SAMSUNG ELECTRO-MECHANICS CO., LTD., Suwon-si (KR)

(72) Inventor: Joon Hyung Lim, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 413 days.

(21) Appl. No.: 15/618,248

(22) Filed: Jun. 9, 2017

(65) Prior Publication Data

US 2018/0143228 A1    May 24, 2018

(30) Foreign Application Priority Data

Nov. 22, 2016 (KR) ............ 10-2016-0156034

(51) Int. Cl.
| | |
|---|---|
| *G01R 19/00* | (2006.01) |
| *G01R 21/133* | (2006.01) |
| *G01R 21/01* | (2006.01) |
| *H03M 1/12* | (2006.01) |

(52) U.S. Cl.
CPC ........... *G01R 21/133* (2013.01); *G01R 21/01* (2013.01); *H03M 1/1245* (2013.01)

(58) Field of Classification Search
CPC ............ G01R 21/133; H03M 1/1245
USPC .......................................... 702/64
See application file for complete search history.

(56) References Cited

U.S. PATENT DOCUMENTS

| | | | |
|---|---|---|---|
| 9,559,792 B1* | 1/2017 | Amir-Aslanzadeh | ........................ H04B 17/12 |
| 2014/0091634 A1* | 4/2014 | Mayo | ..................... H02J 17/00 307/104 |

FOREIGN PATENT DOCUMENTS

| | | |
|---|---|---|
| KR | 2003-0041282 A | 5/2003 |
| KR | 10-1547266 B1 | 8/2015 |

* cited by examiner

*Primary Examiner* — Toan M Le
*Assistant Examiner* — Xiuqin Sun
(74) *Attorney, Agent, or Firm* — NSIP Law (57) ABSTRACT

An apparatus and method thereof are described to measure alternating current (AC) power, including: an AC voltage measurement circuit, an in-phase/quadrature (I/Q) direct down converter, an analog/digital converter, and an AC power calculator. The AC voltage measurement circuit is configured to measure first and second AC positive voltages and first and second AC negative voltages from an AC voltage source. The I/Q direct down converter is configured to directly convert each of the first and second AC positive voltages and the first and second AC negative voltages into an I-signal and a Q-signal orthogonal to each other using down conversion. The analog/digital converter is configured to convert the I-signal and the Q-signal into I-data and Q-data, respectively. The AC power calculator is configured to calculate the AC power using the I-data and the Q-data.

18 Claims, 8 Drawing Sheets

APPARATUS AND METHOD TO MEASURE AC POWER

CROSS-REFERENCE TO RELATED APPLICATION

This application claims the benefit under 35 USC 119(a) of Korean Patent Application No. 10-2016-0156034, filed on Nov. 22, 2016, with the Korean Intellectual Property Office, the disclosure of which is incorporated herein by reference.

BACKGROUND

1. Field

The following description relates to an apparatus and a method to measure alternating current (AC) power.

2. Description of Related Art

In general, a wireless power transmission technology is currently being developed for commercial use. As a result, there is a need for a technology that operates and controls a system by controlling transmission and reception of an amount of power, based on the amount of transmitted power measured at a product and a package having a wireless power transmission and resonator using AC resonance.

The existing method of measuring transmission power of an alternating current directly uses an instantaneous voltage and an instantaneous current applied to a series capacitor in an LC network of the resonator to obtain AC power generated in a resonator.

For example, a frequency of the alternating current (AC) of the transmission power may range from tens to hundreds of MHz. In this case, the AC power is measured by performing analog/digital conversion on an instantaneous voltage and an instantaneous current. Accordingly, to measure the transmission power having a high frequency, a high-performance and high sampling rate differential input ADC is needed, and a high-speed digital signal processor, such as a digital signal processor (DSP), is needed. As a result, manufacturing costs of wireless power transmission technology rise and price competitiveness is reduced.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An aspect of the present disclosure may provide an apparatus and a method to measure alternating current (AC) power by acquiring AC voltage and current information using a low sampling rate ADC, having a sampling frequency ranging from tens to hundreds of KHz, without using a high sampling rate ADC, and by measuring the AC power using the acquired AC voltage and current information.

In accordance with an embodiment, there is provided an apparatus to measure alternating current (AC) power, including: an AC voltage measurement circuit configured to measure first and second AC positive voltages and first and second AC negative voltages from an AC voltage source; an in-phase/quadrature (I/Q) direct down converter configured to directly convert each of the first and second AC positive voltages and the first and second AC negative voltages into an I-signal and a Q-signal orthogonal to each other using down conversion; an analog/digital converter configured to convert the I-signal and the Q-signal into I-data and Q-data, respectively; and an AC power calculator configured to calculate the AC power using the I-data and the Q-data.

The apparatus may further include: a switch circuit connected between the AC voltage measurement circuit and the I/Q direct down converter and configured to select the first and second AC positive voltages and the first and second AC negative voltages, one by one, and transmit the selected AC positive voltage and AC negative voltage to the I/Q direct down converter; and a filter circuit connected between the I/Q direct down converter and the analog/digital converter and configured to remove noise from the I-signal and the Q-signal.

The AC voltage measurement circuit may further include a first measurement capacitor connected to a positive line between the AC voltage measurement circuit and a load and may include one terminal connected to the AC voltage measurement circuit and another terminal opposite thereto; and a second measurement capacitor connected to a negative line between the AC voltage measurement circuit and the load and having one terminal connected to the AC voltage measurement circuit and another terminal opposite thereto, the first and second AC positive voltages are measured at the one terminal and the other terminal of the first measurement capacitor, and the first and second AC negative voltages are measured at the one terminal and the other terminal of the second measurement capacitor.

The AC voltage measurement circuit may further include a first measurement capacitor connected to a positive line between the AC voltage measurement circuit and a load and may include one terminal connected to the AC voltage measurement circuit and another terminal opposite thereto; a second measurement capacitor connected to a negative line between the AC voltage measurement circuit and the load and may include one terminal connected to the AC voltage measurement circuit and another terminal opposite thereto; a first division circuit may include two capacitors connected in series between the one terminal of the first measurement capacitor and a ground, and dividing a voltage applied to the one terminal of the first measurement capacitor to provide a first AC positive voltage of the AC positive voltages; a second division circuit may include two capacitors connected in series between the other terminal of the first measurement capacitor and the ground, and dividing a voltage applied to the other terminal of the first measurement capacitor to provide a second AC positive voltage of the AC positive voltages; a third division circuit may include two capacitors connected in series between one terminal of the second measurement capacitor and the ground, and dividing a voltage applied to one terminal of the second measurement capacitor to provide a first AC negative voltage of the AC negative voltages; and a fourth division circuit including at least two capacitors connected in series between the other terminal of the second measurement capacitor and the ground, and dividing a voltage applied to the other terminal of the second measurement capacitor to provide a second AC negative voltage of the AC negative voltages.

The I/Q direct down converter may further include a first mixer down-converting the first and second AC positive voltages and the first and second AC negative voltages into the I-signal using a first local oscillation signal; and a second mixer down-converting the first and second AC positive voltages and the first and second AC negative voltages into the Q-signal using a second local oscillation signal, wherein the second local oscillation signal includes a phase difference of 90• from the first local oscillation signal.

The AC power calculator may process the I-data and the Q-data to obtain a positive voltage difference between the first and second AC positive voltages and a negative voltage difference between the first and second AC negative voltages, may process a difference voltage between the positive voltage difference and the negative voltage difference to obtain an effective current, may process a difference voltage between the second AC positive voltage and the second AC negative voltage to obtain an effective voltage, and may process the effective current and the effective voltage to obtain the AC power.

In accordance with an embodiment, there is provided a method to measure alternating current (AC) power, including: measuring, by an AC voltage measurement circuit, first and second AC positive voltages and first and second AC negative voltages from an AC voltage source; selecting, by a switch circuit, the first and second AC positive voltages and the first and second AC negative voltages, one by one; directly down converting, by an I/Q direct down converter, the first and second AC positive voltages and the first and second AC negative voltages into an I-signal and a Q-signal orthogonal, respectively; filtering noise, by a filter circuit, from the I-signal and the Q-signal; converting, by an analog/digital converter, the I-signal and the Q-signal from the filter circuit into I-data and Q-data, respectively; and calculating, by an AC power calculator, the AC power using the I-data and the Q-data.

The measuring of the first and second AC positive voltages and the first and second AC negative voltages may further include measuring the first and second AC positive voltages using a first measurement capacitor connected to a positive line between the AC voltage measurement circuit and a load and having one terminal connected to the AC voltage measurement circuit and the other terminal opposite thereto, and measuring the first and second AC negative voltages using a second measurement capacitor connected to a negative line between the AC voltage measurement circuit and the load and having one terminal connected to the AC voltage measurement circuit and the other terminal opposite thereto.

The converting into the I-signal and the Q-signal may further include down-converting the first and second AC positive voltages and the first and second AC negative voltages into the I-signal using a first local oscillation signal; and down-converting the first and second AC positive voltages and the first and second AC negative voltages into the Q-signal using a second local oscillation signal, wherein the second local oscillation signal may include a phase difference of 90• from the first local oscillation signal.

The calculating of the AC power may further include generating a positive voltage difference between the first and second AC positive voltages and a negative voltage difference between the first and second AC negative voltages using the I-data and the Q-data; generating an effective current using a difference voltage between the positive voltage difference and the negative voltage difference; generating an effective voltage using a difference voltage between the second AC positive voltage and the second AC negative voltage; and generating the AC power using the effective current and the effective voltage.

In accordance with an embodiment, there is provided an apparatus, including: an alternating current (AC) voltage measurement circuit may include a first measurement capacitor connected between a first positive terminal and a second positive terminal of a positive line of the AC voltage measurement circuit and to one terminal of a load, a second measurement capacitor connected to a first negative terminal and a second negative terminal of a negative line of the AC voltage measurement circuit and to another terminal of the load, a first division circuit between the first positive terminal and a ground, and configured to divide a voltage applied to the first positive terminal to generate a first AC positive voltage, a second division circuit between the second positive terminal and the ground, and configured to divide a voltage applied to the second positive terminal to generate a second AC positive voltage, a third division circuit between the first negative terminal and the ground, and configured to divide a voltage applied to the first negative terminal to generate a first AC negative voltage, and a fourth division circuit between the second negative terminal and the ground, and configured to divide a voltage applied to the second negative terminal to generate a second AC negative voltage; an in-phase/quadrature (I/Q) down converter configured to convert the first and second AC positive voltages and the first and second AC negative voltages, respectively, into an I-signal and a Q-signal orthogonally to each other; and an AC power calculator configured to calculate an AC power using the I-signal and the Q-signal.

The first division circuit may further include capacitors connected in series between the first positive terminal and the ground, the second measurement capacitor may further include capacitors connected in series between the second positive terminal and the ground, the third division circuit may further include capacitors connected in series between the first negative terminal and the ground, and the fourth division circuit may further include capacitors connected in series between the second negative terminal and the ground.

The I/Q down converter may further include a first mixer and a second mixer to convert the first and second AC positive voltages and the first and second AC negative voltages to the I-signal and the Q-signal.

The first mixer may down-convert the first and second AC positive voltages and the first and second AC negative voltages into the I-signal using a first local oscillation signal.

The second mixer may down-convert the first and second AC positive voltages and the first and second AC negative voltages into the Q-signal using a second local oscillation signal.

The second local oscillation signal may further include a same frequency as the first local oscillation signal and has a phase difference of 90• with the first local oscillation signal.

The apparatus may further include: a filter circuit configured to filter noise from the I-signal and the Q-signal.

The apparatus may further include: an analog/digital converter configured to convert the I-signal and the Q-signal into I-data and Q-data, respectively, wherein the AC power calculator calculates the AC power using the I-data and the Q-data.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
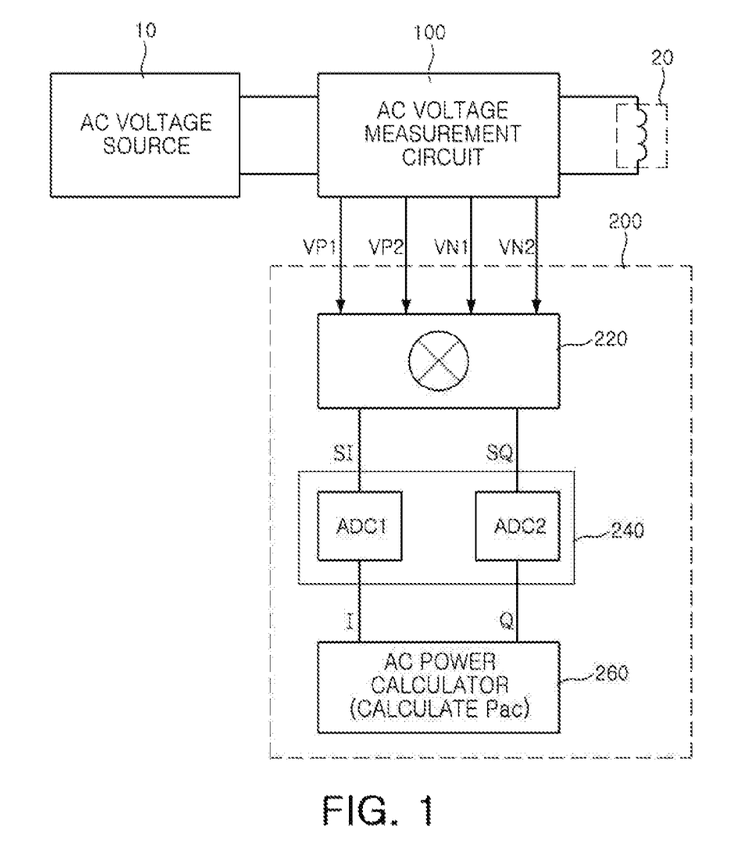
FIG. 1 is a diagram showing an apparatus to measure AC power, according to an embodiment.

FIG. 1 is a diagram showing an apparatus to measure (alternating current) AC power, according to an embodiment.

Referring to FIG. 1, an apparatus to measure AC power, according to an embodiment, includes an AC voltage measurement circuit 100 and an AC power measurer 200.

The AC voltage measurement circuit 100 measures first and second AC positive voltages VP1 and VP2 and first and second AC negative voltages VN1 and VN2 from an AC voltage source 10.

The AC power measurer 200 includes an in-phase/quaudrature (I/Q) direct down converter 220, an A/D converter 240, and an AC power calculator 260.

The I/Q direct down converter 220 directly converts the first and second AC positive voltages VP1 and VP2 and the first and second AC negative voltages VN1 and VN2, respectively, into an I-signal SI and a Q-signal SQ orthogonal to each other using down conversion.

The analog/digital converter 240 converts the I-signal SI and the Q-signal SQ into I-data I and Q-data Q.

The AC power calculator 260 calculates AC power Pac using the I-data I and the Q-data Q.

Figure 2:
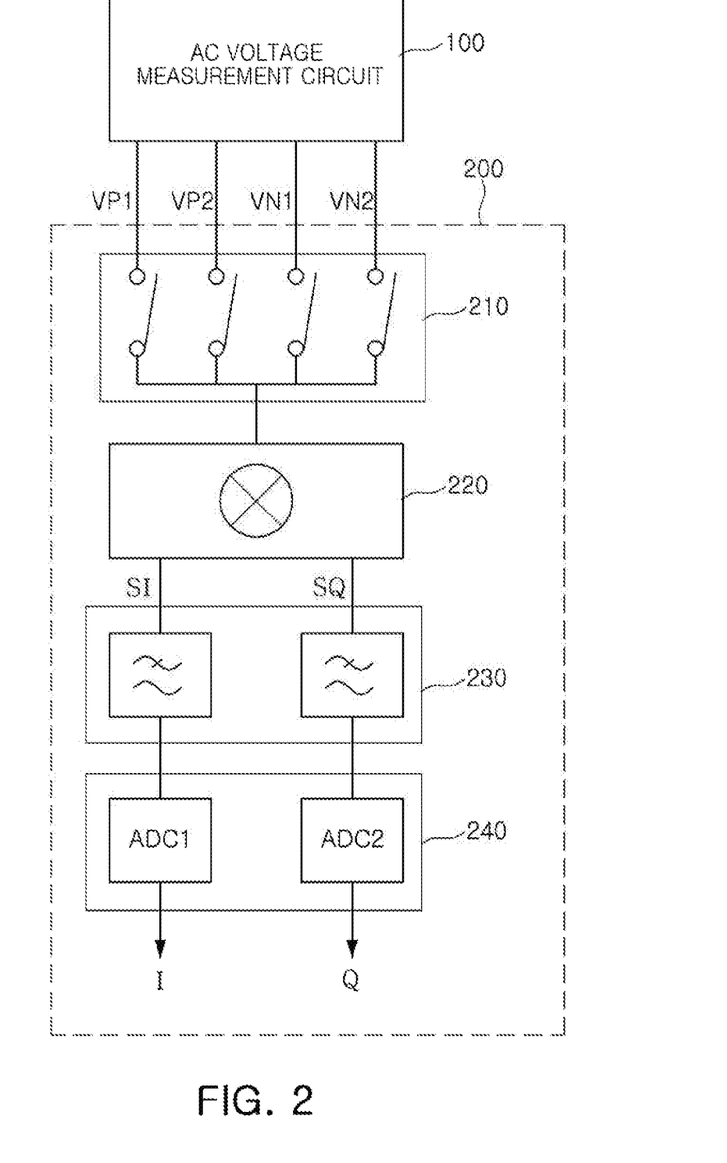
FIG. 2 is a diagram showing an AC power measurer, according to an embodiment.

FIG. 2 is a diagram showing an AC power measurer, according to an embodiment.

The AC power measurer 200 shown in FIG. 2 further includes a switch circuit 210 and a filter circuit 230, in addition to the components shown in FIG. 1.

The switch circuit 210 is connected between the AC voltage measurement circuit 100 and the I/Q direct down converter 220 and is configured to select one of the first and second AC positive voltages VP1 and VP2 and one of the first and second AC negative voltages VN1 and VN2, and transmit the selected AC positive voltage VP1 or VP2 and AC negative voltage VN1 or VN2 to the I/Q direct down converter 220.

As described above, when the AC power measurer 200 may include the switch circuit 210, one of the first and second AC positive voltages VP1 and VP2 and one of the first and second AC negative voltages VN1 and VN2 are sequentially processed one by one or one at a time, respectively.

When the AC power measurer 200 includes the filter circuit 230, the filter circuit 230 is connected between the I/Q direct down converter 220 and the A/D converter 240 to transmit the I-signal SI and the Q-signal SQ and remove noise.

As described above, when the AC power measurer 200 includes the filter circuit 230, noise, such as harmonics, is cut off and the clearer I-signal SI and the Q-signal SQ may be input to the A/D converter 240.

Figure 3:
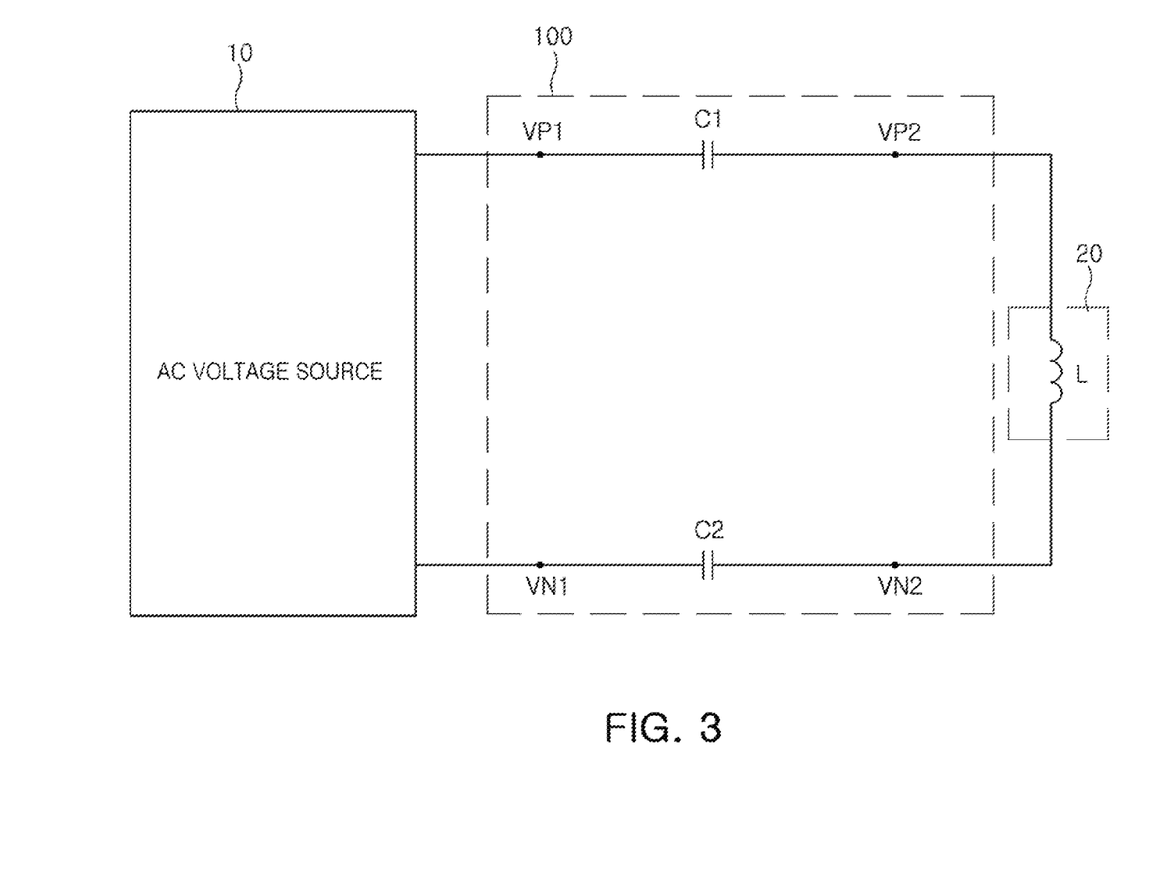
FIG. 3 is a diagram showing an AC voltage measurement circuit, according to an embodiment.

FIG. 3 is a diagram showing an AC voltage measurement circuit, according to an embodiment.

Referring to FIG. 3, the AC voltage measurement circuit 100 include a first measurement capacitor C1 and a second measurement capacitor C2. Here, the first measurement capacitor C1 and the second measurement capacitor C2 may be capacitors included in a resonator for wireless power transmission.

The first measurement capacitor C1 is connected to a positive line, between VP1 and VP2, and between the AC voltage measurement circuit 100 and a load 20.

The second measurement capacitor C2 is connected to a negative line, between VN1 and VN2, and between the AC voltage measurement circuit 100 and the load 20.

The first and second AC positive voltages VP1 and VP2 are measured at one terminal and at another terminal of the first measurement capacitor C1, respectively, and the first and second AC negative voltages VN1 and VN2 are measured at one terminal and at another terminal of the second measurement capacitor C2, respectively.

For example, upon the apparatus to measure AC power being applied to a wireless power transmission apparatus, in response to the first and second measurement capacitors C1 and C2 being the capacitors of the resonator, the load 20 becomes an inductor of the resonator.

Figure 4:
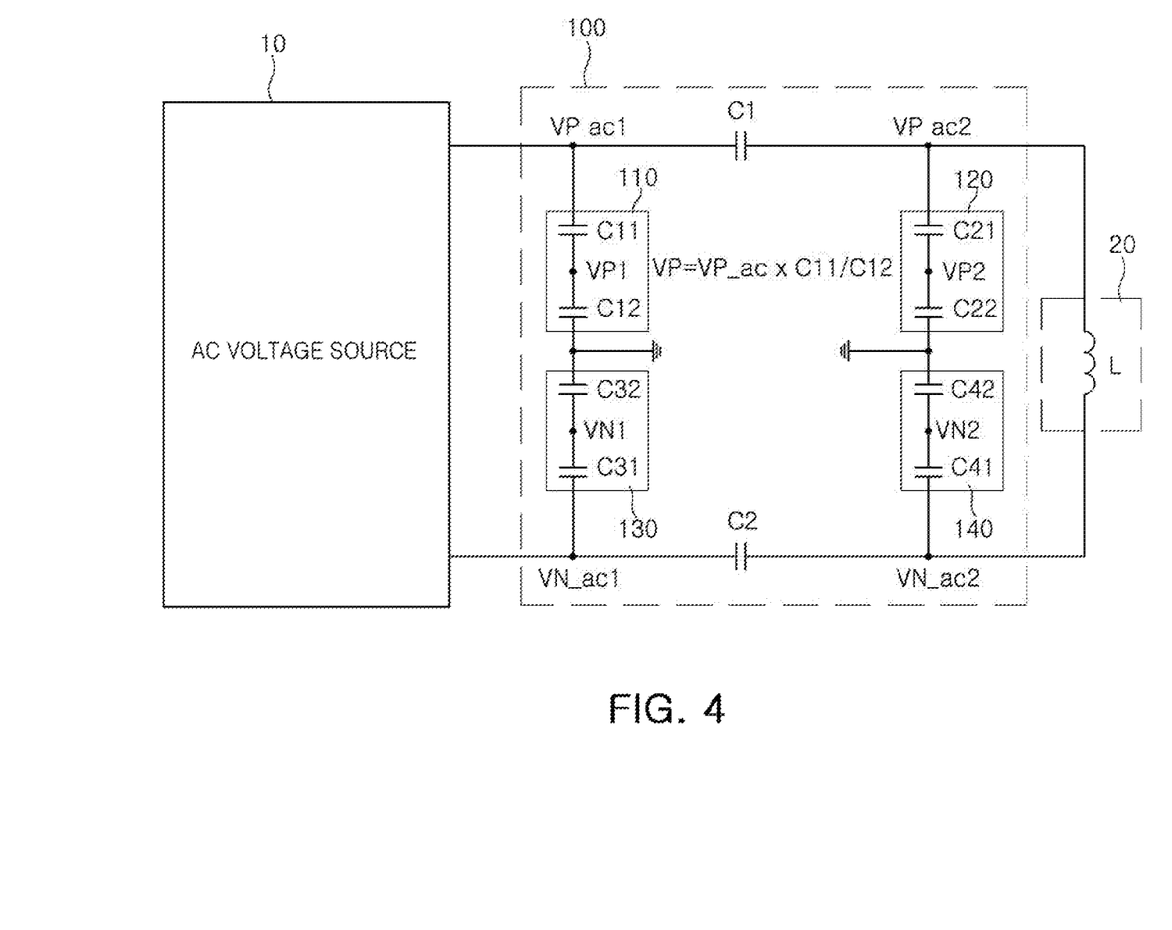
FIG. 4 is another diagram showing the AC voltage measurement circuit, according to an embodiment.

FIG. 4 is another diagram showing the AC voltage measurement circuit, according to an embodiment.

Referring to FIG. 4, the AC voltage measurement circuit 100 includes a first measurement capacitor C1, a second measurement capacitor C2, a first division circuit 110, a second division circuit 120, a third division circuit 130, and a fourth division circuit 140.

The first measurement capacitor C1 is connected between a first positive terminal, VP_ac1, and a second positive terminal, VP_ac2, of a positive line of the AC voltage measurement circuit 100 and one terminal of the load 20.

The second measurement capacitor C2 is connected between a first negative terminal, VN_ac1, and a second negative terminal, VN_ac2, of a negative line of the AC voltage measurement circuit 100 and another terminal of the load 20.

The first division circuit 110 includes at least two capacitors C11 and C12 connected in series between the terminal, VP_ac1, of the first measurement capacitor C1 and a ground, and is configured to divide a voltage applied to the terminal, VP_ac1, of the first measurement capacitor C1 to provide a first AC positive voltage VP1.

In one example, the first AC positive voltage VP1 is a voltage VP1=VP_ac1*(C11/C12), obtained by dividing a voltage VP_ac1 applied to the terminal, VP_ac1, of the first measurement capacitor C1 by the two capacitors C11 and C12.

The second division circuit 120 includes at least two capacitors C21 and C22 connected in series between another terminal, VP_ac2, of the first measurement capacitor C1 and the ground, and is configured to divide a voltage applied to the other terminal, VP_ac2, of the first measurement capacitor C1 to provide the second AC positive voltage VP2.

In an example, the second AC positive voltage VP2 is a voltage VP2=VP_ac2*(C21/C22), obtained by dividing a voltage VP_ac2 applied to the other terminal of the first measurement capacitor C1 by the two capacitors C21 and C22.

The third division circuit 130 includes at least two capacitors C31 and C32 connected in series between one terminal, VN_ac1, of the second measurement capacitor C2 and the ground, and is configured to divide a voltage applied to the one terminal, VN_ac1, of the second measurement capacitor C2 to provide the first AC negative voltage VN1.

In an example, the first AC negative voltage VN1 is a voltage VN1=VN_ac1*(C31/C32), obtained by dividing a voltage VN_ac1 applied to one terminal of the second measurement capacitor C2 by the two capacitors C31 and C32.

Further, the fourth division circuit 140 includes at least two capacitors C41 and C42 connected in series between another terminal, VN_ac2, of the second measurement capacitor C2 and the ground, and is configured to divide a voltage applied to the other terminal, VN_ac2, of the second measurement capacitor C2 to provide the second AC negative voltage VN2.

In an example, the second AC negative voltage VN2 may be a voltage VN2=VN_ac2*(C41/C42), obtained by dividing a voltage VN_ac2 applied to the other terminal of the second measurement capacitor C2 by the two capacitors C41 and C42.

Figure 5:
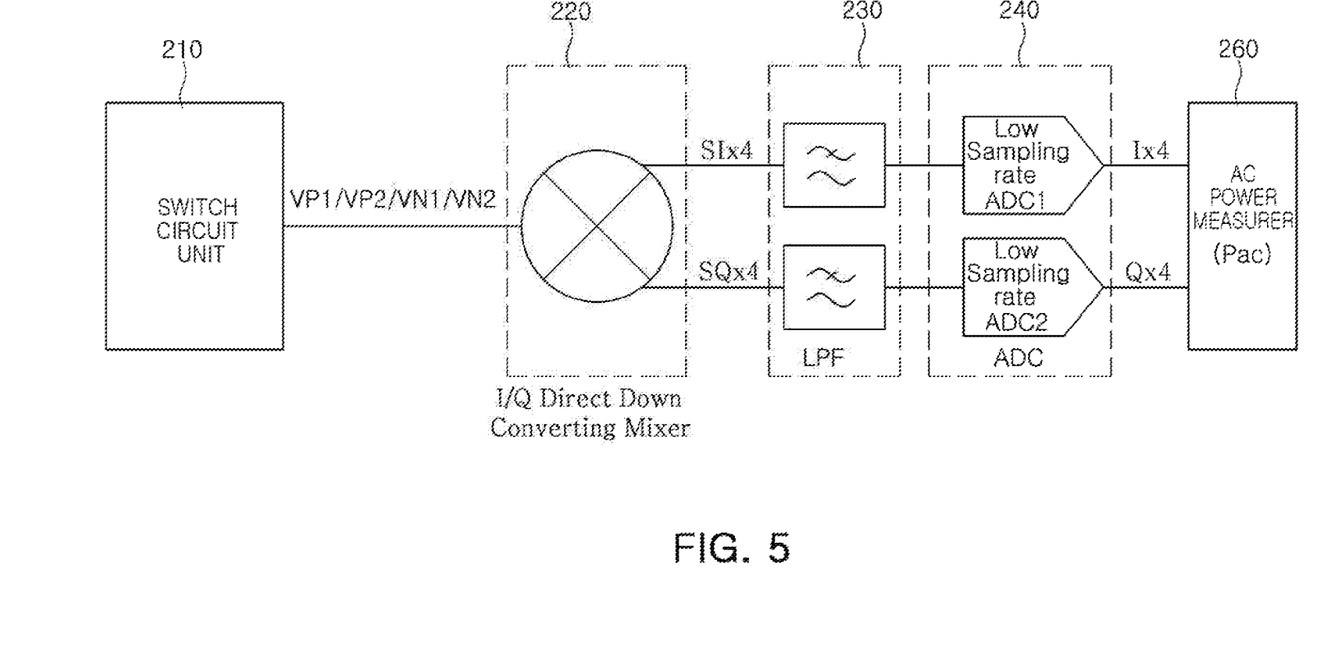
FIG. 5 is a diagram showing an AC power measurer, according to an embodiment.

FIG. 5 is a diagram showing an AC power measurer, according to an embodiment.

Referring to FIG. 5, the AC voltage measurer 200 includes the switch circuit 210, the I/Q direct down converter 220, the filter circuit 230, the A/D converter 240, and the AC power calculator 260. Each component is the same as is described above with reference to FIGS. 1 and 4.

Figure 6:
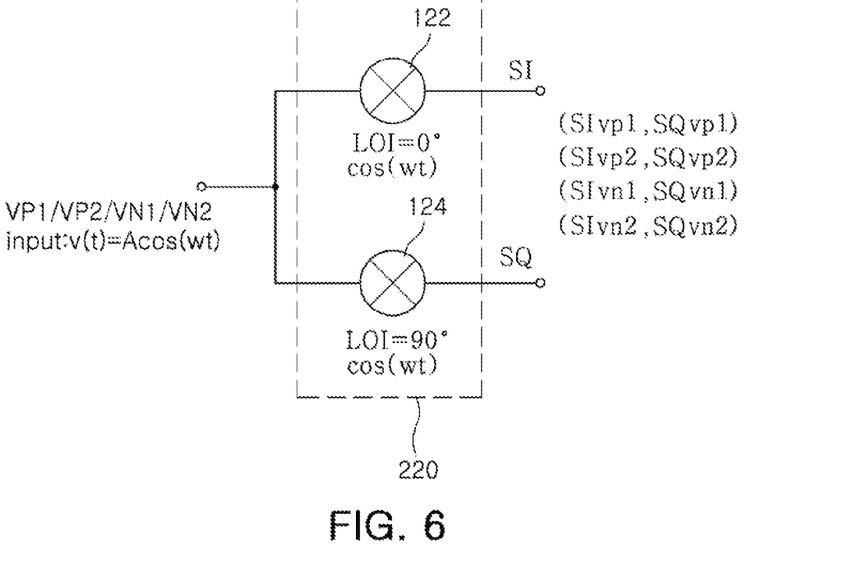
FIG. 6 is a diagram showing an I/Q direct down converter, according to an embodiment.

FIG. 6 is a diagram showing an I/Q direct down converter, according to an embodiment.

Referring to FIG. 6, the I/Q direct down converter 220 includes a first mixer 222 and a second mixer 224 configured to convert an input voltage, V (t), to the I-signal, SI, and the Q-signal, SQ.

The first mixer 222 down-converts the first and second AC positive voltages VP1 and VP2 and the first and second AC negative voltages VN1 and VN2 into the I-signal SI using a first local oscillation signal LO1.

The second mixer 224 down-converts the first and second AC positive voltages VP1 and VP2 and the first and second AC negative voltages VN1 and VN2 into the Q-signal SQ using a second local oscillation signal LO2.

The second local oscillation signal LO2 may have the same frequency as the first local oscillation signal LO1 and have a phase difference of 90°.

For example, the first AC positive voltage VP1 is converted into SIvp1 and SQvp1 by the first mixer 222 and the second mixer 224, respectively. The second AC positive voltage VP2 is converted into SIvp2 and SQvp2, the first AC negative voltage VN1 is converted into SIvn1 and SQvn1, and the second AC negative voltage VN2 is converted into SIvn2 and SQvn2.

Figure 7:
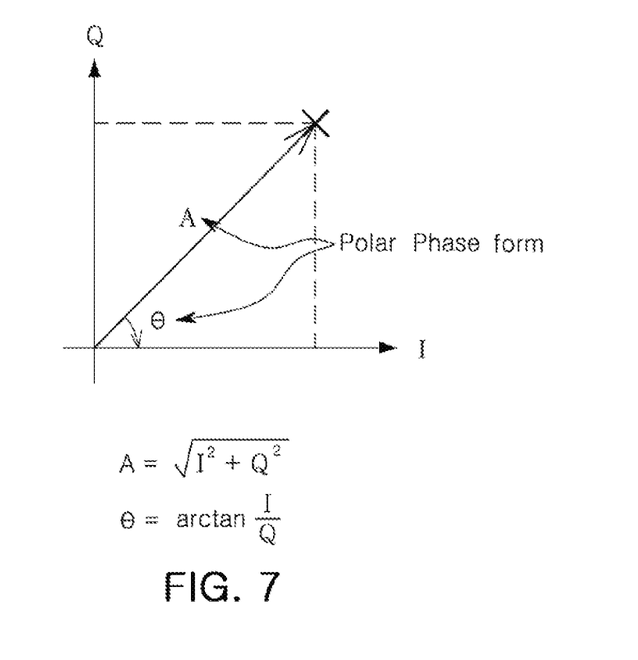
FIG. 7 is an I/Q polar form plot, according to an embodiment.

FIG. 7 is an I/Q polar form plot, according to an embodiment.

Referring to FIG. 7, when an input signal S(t) is A cos(wt), I-data I is A cos(wt)*cos (wt)* and Q-data Q is A cos(wt) *sin(wt). In this example, an amplitude A and a phase θ of a vector is expressed by the following Equation 1.

$$A = \sqrt{I^2 + Q^2}$$
$$\theta = \arctan\left(\frac{Q}{I}\right)$$

[Equation 1]

Referring to FIGS. 1 through 7, the AC power calculator 260 uses the I-data I and the Q-data Q from the A/D converter 240 to obtain a positive voltage difference ΔVP1_2 between the first and second AC positive voltages VP1 and VP2 and a negative voltage difference ΔVN1_2 between the first and second AC negative voltages VN1 and VN2. In an example, a difference voltage ΔVc between the positive voltage difference ΔVP1_2 and the negative voltage difference ΔVN1_2 is obtained by the following Equation 2.

$$\Delta VP1\_2 = (Ivp1, Qvp1) - (Ivp2, Qvp2) = (Ip, Qp)$$ [Equation 2]

$$\Delta VN1\_2 = (Ivn1, Qvn1) - (Ivn2, Qvn2) = (In, Qn)$$

$$\Delta Vc = \Delta VP1\_2 - \Delta VN1\_2 = (Itot\_I, Qtot\_I)$$

$$\Delta Vc = \sqrt{(Itot\_I)^2 + (Qtot\_I)^2},$$

$$\text{Arctan}(Itot\_I, /Qtot\_I) = > phaseform$$

In Equation 2, above, Ivp1 and Qvp1 are the I-data and the Q-data, respectively, in which the first AC positive voltage VP1 is converted, Ivp2 and Qvp2 are the I-data and the Q-data, respectively, in which the second AC positive voltage VP2 is converted, Ivn1 and Qvn1 are I-data and Q-data, respectively, in which the first AC negative voltage VN1 is converted, and Ivn2 and Qvn2 are the I-data and the Q-data, respectively, in which the second AC negative voltage VN2 is converted. Further, Itot_I and Qtot_I each may be the I-data and the Q-data, respectively, for the total current.

Subsequently, the AC power calculator 260 generates, calculates, or produces an AC current Iac using the difference voltage ΔVc, representing the difference between the positive voltage difference ΔVP1_2 and the negative voltage difference ΔVN1_2, generates, calculates, or produces an effective current Irms based on the AC current Iac, generates, calculates, or produces an AC voltage Vac using the difference of voltages between the second AC positive voltage VP2 and the second AC negative voltage VN2, and generates, calculates, or produces an effective voltage Vrms by multiplying 2πfc by the AC voltage Vac, as expressed by the following Equation 3.

$$Iac = \Delta Vac / jXc = 2\pi fc * \sqrt{(Itot\_I)^2 + (Qtot\_I)^2},$$ [Equation 3]

$$\text{Arctan}(Itot\_I / Qtot\_I)$$

$$Vac = VP2 - VN2 = (Ivp2, Qvp2) - (Ivn2, Qvn2) =$$

$$(Itot\_V, Qtot\_V) = \sqrt{(Itot\_V)^2 + (Qtot\_V)^2},$$

$$\text{Arctan}(Itot\_V, /Qtot\_V) = > phaseform$$

$$Vrms = \sqrt{(Itot\_V)^2 + (Qtot\_V)^2} / (2\sqrt{2})$$

$$Irms = \pi * f * c * \sqrt{(Itot\_V)^2 + (Qtot\_V)^2} / \sqrt{2}$$

In Equation 3, above, Xc may be 1/jwC, and Itot_V and Qtot_V each may be the I-data and the Q-data for the total voltage.

The AC power Pac is obtained by the following Equation 4, using the effective current Irms and the effective voltage Vrms.

$$Pac=(C12/C11)^2 Vrms*Irms*\cos\theta(\theta - \text{Arctan}(Qtot\_V/Itot\_V) - \text{Arctan}(Qtot\_I/Itot\_I))$$ [Equation 4]

In Equation 4, above, and FIG. 4, C11=C21=C31=C41, and C12=C22=C32=C42 is satisfied.

Figure 8:
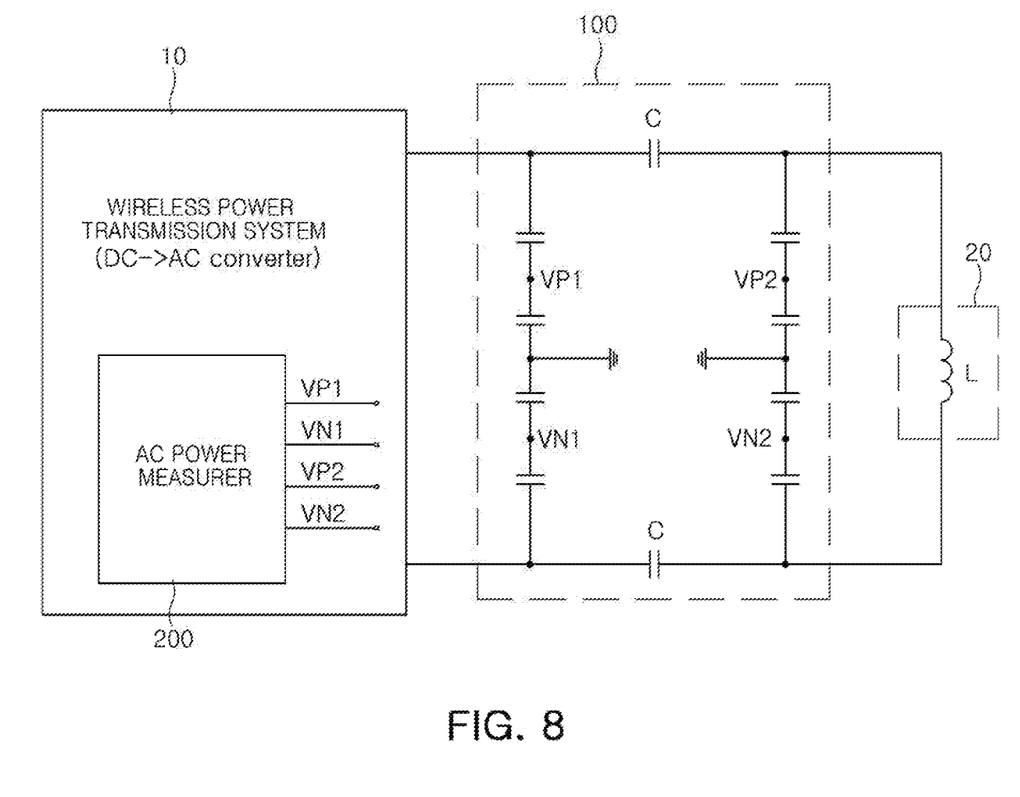
FIG. 8 is a diagram showing an application of an apparatus to measure AC power, according to an embodiment.

FIG. 8 is a diagram showing an application example of an apparatus to measure AC power, according to an embodiment.

Referring to FIG. 8, in the apparatus to measure AC power, according to an embodiment, the AC voltage source 10 is a wireless power transmission system. In this case, the AC power measurer 200 is included in the wireless power transmission system.

FIG. 8 shows an example of an application in which the apparatus to measure AC power is applied to an actual system or module. By the AC power measurement shown in FIG. 8, it is possible to monitor how much of the AC power is being transmitted by the wireless power transmission system. Further, by a desired control formula or algorithm, it is possible to control the transmission power to a desired magnitude.

Hereinafter, a method to measure AC power will be described with reference to FIGS. 1 through 9. In the present application, descriptions of the apparatus and method to measure AC power may supplement each other unless otherwise specified.

Figure 9:
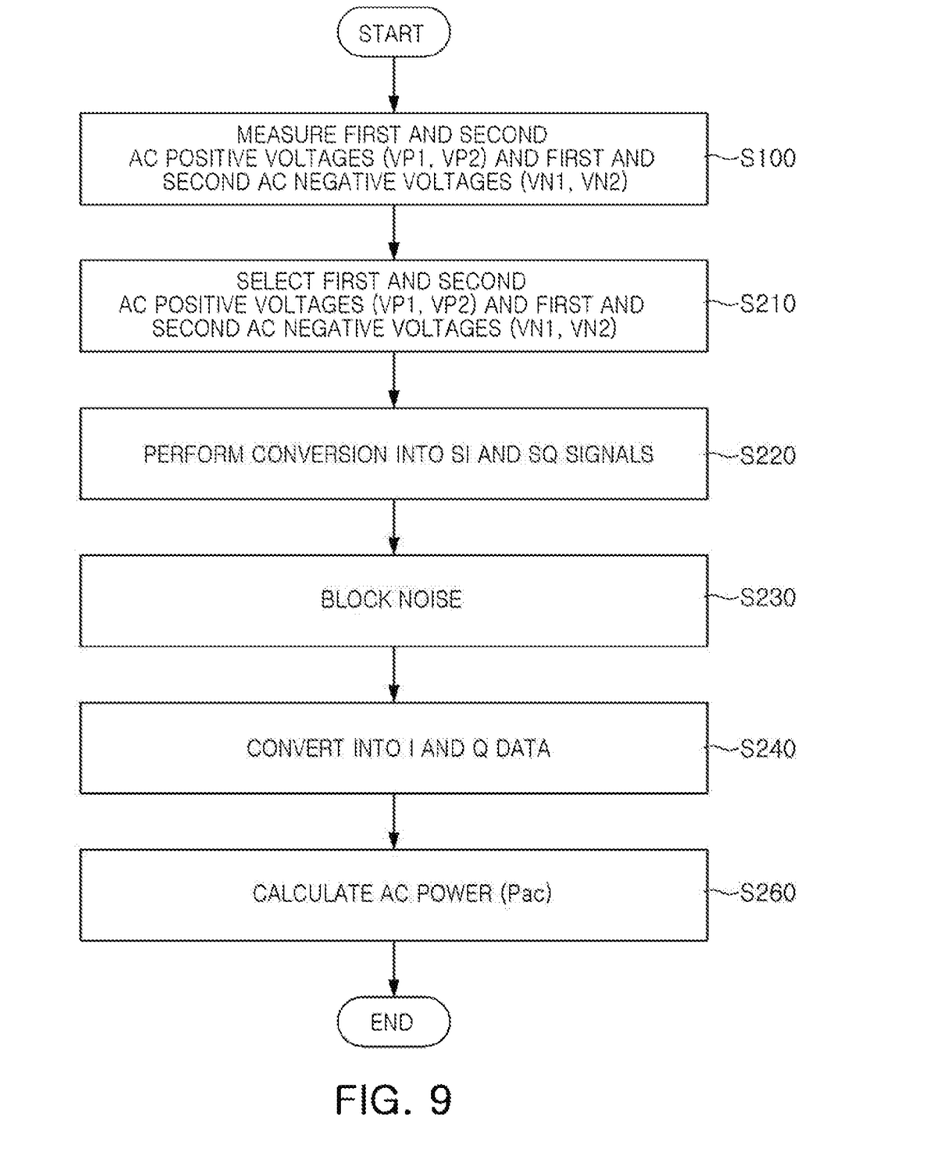
FIG. 9 is a flow chart showing a method to measure AC power, according to an embodiment.

FIG. 9 is a flow chart showing an example of a method to measure AC power, according to an embodiment.

The method to measure AC power, according to an embodiment, will be described with reference to FIGS. 1 through 9.

Hereinafter, the description of the method to measure AC power includes the operation description with reference to FIGS. 1 through 8. Accordingly, overlapping descriptions of the method to measure AC power may be omitted, as much as possible.

Referring to FIG. 9, the method to measure AC power includes operations S100, S210, S220, S230, S240, and S260.

First, in operation S100, the AC voltage measurement circuit 100 measures the first and second AC positive voltages VP1 and VP2 and the first and second AC negative voltages VN1 and VN2 from the AC voltage source 10.

Next, in operation S210, the switch circuit 210 selects the first and second AC positive voltages VP1 and VP2 and the first and second AC negative voltages VN1 and VN2, one by one.

Next, in operation S220, the I/Q direct down converter 220 directly converts the first and second AC positive voltages VP1 and VP2 and the first and second AC negative voltages VN1 and VN2, respectively, into the I-signal SI and the Q-signal SQ orthogonal to each other by the down conversion.

Next, in operation S230, the filter circuit 230 passes the I-signal SI and the Q-signal SQ and blocks or cancels noise.

Next, in operation S240, the analog/digital converter 240 converts the I-signal SI and the Q-signal SQ from the filter circuit 230 into the I-data I and the Q-data Q.

Further, in operation S260, the AC power calculator 260 calculates the AC power Pac using the I-data I and the Q-data Q.

As described above, in response to the frequency of the AC power being a high frequency ranging from tens to hundreds of MHz, because a sampling rate ADC needs to be at least two times as high as a frequency of an input signal and the ADC having three to eight times faster sampling rate is actually used, the high-end functional block having a high resolution is required to precisely express a magnitude of the instantaneous voltage, such that the difficulty in implementing the system due to the system complexity and the high-end functional block may be increased and the cost may be increased.

To overcome such disadvantages, the direct down converter converts an instantaneous voltage v(t) and an instantaneous current i(t) into an I/Q-signal of direct current (DC)

of a polar phase form, and the low sample rate ADC performs a basic digital operation to obtain the voltage and the current in the polar form to calculate the AC power Pac. As a result, the actual AC power of the LC resonator driven at tens to hundreds of frequency is calculated without a complex system and an effective high-end functional block.

Further, in wireless power transmission technology, an instantaneous value calculation (subtraction and multiplication) is needed. Therefore, there is a need to simultaneously process the input signals in real time at the time of the ADC time sharing conversion. However, the apparatus, according to an embodiment, uses the mixer and the ADC time sharing to process the first and second AC positive voltages VP1 and VP2 and the first and second AC negative voltages VN1 and VN2 in parallel or converts the first and second AC positive voltages VP1 and VP2 and the first and second AC negative voltages VN1 and VN2 sequentially, by using the signal in the I/Q polar form of the DC information. In an example, in the former case, at the time of parallel processing, the number of functional blocks may be required to be as many as the number of inputs to be processed in parallel. In the latter case, one of the functional blocks may be used by the time sharing, such that the cost may be lower and the system may be simpler than in existing technology.

As set forth above, according to an embodiment, when the driving frequency of the resonator is a high frequency, ranging from tens to hundreds of MHz, the AC power is calculated based on the I-signal and the Q-signal having the phase difference into which the instantaneous voltage and the instantaneous current are converted by the I/Q direct down converter and the low sampling rate ADC, such that the system complexity may be reduced and the calculation block is simplified, and the AC power may be calculated without using the expensive ADC, such that an inexpensive AC power apparatus may be manufactured.

The circuits, measurers, converters, calculators, and sources in FIGS. 1-8 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The method illustrated in FIG. 9 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus to measure alternating current (AC) power, comprising:
    an AC voltage measurement circuit configured to measure first and second AC positive voltages and first and second AC negative voltages from an AC voltage source;
    an in-phase/quadrature (I/Q) direct down converter configured to directly convert each of the first and second AC positive voltages and the first and second AC negative voltages into an I-signal and a Q-signal orthogonal to each other using down conversion;
    an analog/digital converter configured to convert the I-signal and the Q-signal into I-data and Q-data, respectively; and
    an AC power calculator configured to calculate the AC power using the I-data and the Q-data,
    wherein the AC voltage measurement circuit comprises:
        a first measurement capacitor connected to a positive line between the AC voltage measurement circuit and a load and comprising one terminal connected to the AC voltage measurement circuit and another terminal opposite thereto; and
        a first division circuit comprising two capacitors connected in series between the one terminal of the first measurement capacitor and a ground, and dividing a voltage applied to the one terminal of the first measurement capacitor to provide a first AC positive voltage of the AC positive voltages.

2. The apparatus of claim 1, further comprising:
    a switch circuit connected between the AC voltage measurement circuit and the I/Q direct down converter and configured to select the first and second AC positive voltages and the first and second AC negative voltages, one by one, and transmit the selected AC positive voltage and AC negative voltage to the I/Q direct down converter; and
    a filter circuit connected between the I/Q direct down converter and the analog/digital converter and configured to remove noise from the I-signal and the Q-signal.

3. The apparatus of claim 1, wherein the AC voltage measurement circuit further comprises:
    a second measurement capacitor connected to a negative line between the AC voltage measurement circuit and the load and having one terminal connected to the AC voltage measurement circuit and another terminal opposite thereto,
    the first and second AC positive voltages are measured at the one terminal and the other terminal of the first measurement capacitor, and
    the first and second AC negative voltages are measured at the one terminal and the other terminal of the second measurement capacitor.

4. The apparatus of claim 1, wherein the AC voltage measurement circuit further comprises:
    a second measurement capacitor connected to a negative line between the AC voltage measurement circuit and the load and comprising one terminal connected to the AC voltage measurement circuit and another terminal opposite thereto;
    a second division circuit comprising two capacitors connected in series between the other terminal of the first measurement capacitor and the ground, and dividing a voltage applied to the other terminal of the first measurement capacitor to provide a second AC positive voltage of the AC positive voltages;
    a third division circuit comprising two capacitors connected in series between one terminal of the second measurement capacitor and the ground, and dividing a voltage applied to one terminal of the second measurement capacitor to provide a first AC negative voltage of the AC negative voltages; and
    a fourth division circuit including at least two capacitors connected in series between the other terminal of the second measurement capacitor and the ground, and dividing a voltage applied to the other terminal of the second measurement capacitor to provide a second AC negative voltage of the AC negative voltages.

5. The apparatus of claim 4, wherein the AC power calculator processes the I-data and the Q-data to obtain a positive voltage difference between the first and second AC positive voltages and a negative voltage difference between the first and second AC negative voltages, processes a difference voltage between the positive voltage difference and the negative voltage difference to obtain an effective current, processes a difference voltage between the second AC positive voltage and the second AC negative voltage to obtain an effective voltage, and processes the effective current and the effective voltage to obtain the AC power.

6. The apparatus of claim 1, wherein the I/Q direct down converter comprises:

a first mixer down-converting the first and second AC positive voltages and the first and second AC negative voltages into the I-signal using a first local oscillation signal; and a second mixer down-converting the first and second AC positive voltages and the first and second AC negative voltages into the Q-signal using a second local oscillation signal, wherein the second local oscillation signal comprises a phase difference of 90° from the first local oscillation signal.

7. A method to measure alternating current (AC) power, comprising:

measuring, by an AC voltage measurement circuit, first and second AC positive voltages and first and second AC negative voltages from an AC voltage source;

selecting, by a switch circuit, the first and second AC positive voltages and the first and second AC negative voltages, one by one;

directly down converting, by an I/Q direct down converter, the first and second AC positive voltages and the first and second AC negative voltages into an I-signal and a Q-signal orthogonal, respectively;

filtering noise, by a filter circuit, from the I-signal and the Q-signal;

converting, by an analog/digital converter, the I-signal and the Q-signal from the filter circuit into I-data and Q-data, respectively; and calculating, by an AC power calculator, the AC power using the I-data and the Q-data, wherein the AC voltage measurement circuit comprises:

a first measurement capacitor connected to a positive line between the AC voltage measurement circuit and a load and comprising one terminal connected to the AC voltage measurement circuit and another terminal opposite thereto; and a first division circuit comprising two capacitors connected in series between the one terminal of the first measurement capacitor and a ground, and dividing a voltage applied to the one terminal of the first measurement capacitor to provide a first AC positive voltage of the AC positive voltages.

8. The method of claim 7, wherein the measuring of the first and second AC positive voltages and the first and second AC negative voltages comprises:

measuring the first and second AC positive voltages using the first measurement capacitor, and measuring the first and second AC negative voltages using a second measurement capacitor connected to a negative line between the AC voltage measurement circuit and the load and having one terminal connected to the AC voltage measurement circuit and the other terminal opposite thereto.

9. The method of claim 8, wherein the calculating of the AC power comprises:

generating a positive voltage difference between the first and second AC positive voltages and a negative voltage difference between the first and second AC negative voltages using the I-data and the Q-data;

generating an effective current using a difference voltage between the positive voltage difference and the negative voltage difference;

generating an effective voltage using a difference voltage between the second AC positive voltage and the second AC negative voltage; and generating the AC power using the effective current and the effective voltage.

10. The method of claim 7, wherein the converting into the I-signal and the Q-signal comprises:

down-converting the first and second AC positive voltages and the first and second AC negative voltages into the I-signal using a first local oscillation signal; and down-converting the first and second AC positive voltages and the first and second AC negative voltages into the Q-signal using a second local oscillation signal, wherein the second local oscillation signal comprises a phase difference of 90° from the first local oscillation signal.

11. An apparatus, comprising:

an alternating current (AC) voltage measurement circuit comprising a first measurement capacitor connected between a first positive terminal and a second positive terminal of a positive line of the AC voltage measurement circuit and to one terminal of a load, a second measurement capacitor connected to a first negative terminal and a second negative terminal of a negative line of the AC voltage measurement circuit and to another terminal of the load, a first division circuit between the first positive terminal and a ground, and configured to divide a voltage applied to the first positive terminal to generate a first AC positive voltage, a second division circuit between the second positive terminal and the ground, and configured to divide a voltage applied to the second positive terminal to generate a second AC positive voltage, a third division circuit between the first negative terminal and the ground, and configured to divide a voltage applied to the first negative terminal to generate a first AC negative voltage, and a fourth division circuit between the second negative terminal and the ground, and configured to divide a voltage applied to the second negative terminal to generate a second AC negative voltage;

an in-phase/quadrature (I/Q) down converter configured to convert the first and second AC positive voltages and the first and second AC negative voltages, respectively, into an I-signal and a Q-signal orthogonally to each other; and an AC power calculator configured to calculate an AC power using the I-signal and the Q-signal.

12. The apparatus of claim 11, wherein the first division circuit comprises capacitors connected in series between the first positive terminal and the ground, the second measurement capacitor comprises capacitors connected in series between the second positive terminal and the ground, the third division circuit comprises capacitors connected in series between the first negative terminal and the ground, and the fourth division circuit comprises capacitors connected in series between the second negative terminal and the ground.

13. The apparatus of claim 11, wherein the I/Q down converter comprises a first mixer and a second mixer to convert the first and second AC positive voltages and the first and second AC negative voltages to the I-signal and the Q-signal.

14. The apparatus of claim 13, wherein the first mixer down-converts the first and second AC positive voltages and the first and second AC negative voltages into the I-signal using a first local oscillation signal.

15. The apparatus of claim 14, wherein the second mixer down-converts the first and second AC positive voltages and the first and second AC negative voltages into the Q-signal using a second local oscillation signal.

16. The apparatus of claim 15, wherein the second local oscillation signal comprises a same frequency as the first local oscillation signal and has a phase difference of 90° with the first local oscillation signal.

17. The apparatus of claim 11, further comprising:
a filter circuit configured to filter noise from the I-signal and the Q-signal.

18. The apparatus of claim 11, further comprising:
an analog/digital converter configured to convert the I-signal and the Q-signal into I-data and Q-data, respectively, wherein the AC power calculator calculates the AC power using the I-data and the Q-data.

* * * * *